(12) United States Patent
Takahashi

(10) Patent No.: US 7,470,956 B2
(45) Date of Patent: Dec. 30, 2008

(54) SEMICONDUCTOR DEVICE AND MANUFACTURING METHOD THEREOF

(75) Inventor: Tetsuya Takahashi, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 135 days.

(21) Appl. No.: 11/395,772

(22) Filed: Mar. 31, 2006

(65) Prior Publication Data

US 2006/0231867 A1    Oct. 19, 2006

(30) Foreign Application Priority Data

Apr. 19, 2005    (JP) ............... 2005-121434

(51) Int. Cl.
*H01L 29/72* (2006.01)
(52) U.S. Cl. ............ 257/347; 257/288; 257/408; 257/655
(58) Field of Classification Search ......... 257/288, 257/347, 408, 655
See application file for complete search history.

(56) References Cited

U.S. PATENT DOCUMENTS 5,098,861 A * 3/1992 Blackstone ............... 438/406

FOREIGN PATENT DOCUMENTS

JP    06-120458    4/1994

* cited by examiner

*Primary Examiner*—Edward Wojciechowicz
(74) *Attorney, Agent, or Firm*—Howard & Howard Attorneys, P.C.

(57) ABSTRACT

A semiconductor device has a semiconductor base, an anode electrode, and a cathode electrode. The semiconductor base includes a P type semiconductor substrate, an insulating film, an $N^-$ type semiconductor region formed on the insulating film, an $N^+$ type semiconductor region, and a $P^+$ type semiconductor region facing the $N^+$ type semiconductor region via the $N^-$ type semiconductor region. The semiconductor device further has an N type diffusion layer which is formed, in the $N^-$ type semiconductor region at the interface between the insulating film and the $N^-$ type semiconductor region, so as to have a concentration gradient such that the N type impurity concentration increases from the side of the anode electrode to the side of the cathode electrode.

10 Claims, 9 Drawing Sheets

SEMICONDUCTOR DEVICE AND MANUFACTURING METHOD THEREOF

BACKGROUND OF THE INVENTION

1. Field of the Invention

The present invention relates to a semiconductor device having a so-called SOI (Semiconductor On Insulator) structure in which a semiconductor layer is formed on a substrate via an insulating film, and a manufacturing method thereof.

2. Description of the Related Art

Conventionally, semiconductor devices, whose semi-conductive region has a thickness of several hundred μm, have the superficial several μm thickness function as the device, and the remaining several hundred μm semi-conductive region is used as a support substrate. However, when the surface of the semi-conductive region of such a semiconductor device is made to function as the device, an electric current also flows into the region used as the support substrate, making electric charges to pool therein. The pool of electric charges in the support substrate is a disturbance against improving the switching speed of the semiconductor device and reducing electricity consumption.

Hence, as disclosed in, for example, Unexamined Japanese Patent Application KOKAI Publication No. H6-120458, such a semiconductor device is developed, which has a Semiconductor On Insulator structure (hereinafter referred to as SOI structure), which has an insulating layer between the portion used as the device and the portion used as the substrate so as not to allow the electric charges to pool in the support substrate.

An example of the formation of a conventional diode having the SOI structure is shown in FIG. 8. As shown in FIG. 8, a semiconductor device 80 comprises a P type semiconductor substrate 81, an insulating film 82, an N⁻ type semiconductor region 83, an N⁺ type semiconductor region 84, a P⁺ type semiconductor region 85, an anode electrode 87, and a cathode electrode 88. As a method for increasing the voltage withstand characteristic of the semiconductor device 80, a method of increasing the thickness of the insulating film 82 has conventionally been employed.

SUMMARY OF THE INVENTION

However, there is a manufacturing limitation in raising the voltage withstand characteristic by increasing the thickness of the insulating film 82.

There is also a method of optimizing the thickness and impurity concentration of the N⁻ type semiconductor region 83, in order to increase the voltage withstand characteristic of the semiconductor device 80. However, if the thickness of the N⁻ type semiconductor region 83 is thinned, it becomes harder to design the portion to be used as the device. Further, if the N⁻ type semiconductor region 83 is changed, the characteristic of the portion to function as the device is also changed.

There is also a method of increasing the distance between the anode electrode 87 and the cathode electrode 88, as a method for increasing the voltage withstand characteristic. However, this method has a problem that the size of the semiconductor device 80 becomes large.

Thus, such a method is demanded, which can achieve a better voltage withstand characteristic than obtained by the conventionally employed method of increasing the thickness of the insulating film, without changing the thickness of the insulating film 82, the thickness of the N⁻ type semiconductor region 83, the impurity concentration of the N⁻ type semiconductor region 83, etc.

The present invention was made in view of the above-described circumstance, and an object of the present invention is to provide a semiconductor device having a high voltage withstand characteristic. Particularly, an object of the present invention is to provide a semiconductor device which can achieve a favorable voltage withstand characteristic, without changing the size or the impurity concentration of the semiconductor device.

To achieve the above objects, a semiconductor device according to a first aspect of the present invention comprises a semiconductor base comprising: a substrate; an insulating film formed on the substrate; a first semiconductor region having a first conductivity type formed on the insulating film; a second semiconductor region having the first conductivity type formed on a surface region of the first semiconductor region; and a third semiconductor region having a second conductivity type formed on a surface region of the first semiconductor region so as to face the second semiconductor region via the first semiconductor region;

a first electrode formed on the second semiconductor region of the semiconductor base, and a second electrode formed on the third semiconductor region of the semiconductor base, and further comprises a diffusion layer on a surface of the first semiconductor region contacting the insulating layer, the diffusion layer having a gradient of concentration of an impurity having the first conductivity type, from a side of the first electrode to a side of the second electrode.

To achieve the above objects, a semiconductor device according to a second aspect of the present invention comprises a semiconductor base comprising: a substrate; an insulating film formed on the substrate; a first semiconductor region having a first conductivity type formed on the insulating film; a second semiconductor region having the first conductivity type formed on a surface region of the first semiconductor region; a third semiconductor region having a second conductivity type formed on a surface region of the first semiconductor region so as to face the second semiconductor region via the first semiconductor region; and a fourth semiconductor region formed in a surface region of the third semiconductor region, a gate electrode formed so as to face the third semiconductor region, of the semiconductor base, which is sandwiched between the first semiconductor region and the fourth semiconductor region, a first electrode formed on the second semiconductor region of the semiconductor base, and a second electrode formed on the third semiconductor region of the semiconductor base, and further comprises a diffusion layer on a surface of the first semiconductor region contacting the insulating film, the diffusion layer having a gradient of concentration of an impurity having the first conductivity type, from a side of the first electrode to a side of the second electrode.

The diffusion layer may have a gradient of concentration of an impurity, which is almost constant from the side of the first electrode to the side of the second electrode.

The diffusion layer may be formed of a plurality of first regions formed so as to have a constant impurity concentration, and a plurality of second regions whose impurity concentrations are varied from the side of the first electrode to the side of the second electrode, and the first regions and the second regions may be arranged alternately.

Values of average of the impurity concentration of the first region and the impurity concentration of the second region adjoining the first region may have a constant gradient which is almost constant from the side of the first electrode to the side of the second electrode.

The second semiconductor region and the third semiconductor region may be formed so as to extend from the surface regions of the first semiconductor region so as to contact the insulating film, and the diffusion layer may be formed so as to contact the second semiconductor region and the third semiconductor region.

The semiconductor device may further comprise an insulating film on a surface of the diffusion layer contacting the first semiconductor region, and the insulating film may be formed so as to expose at least a part of the diffusion layer.

The thickness of the diffusion layer may be 0.01 to 1.00 µm.

To achieve the above objects, a semiconductor device according to a third aspect of the present invention comprises
a semiconductor base comprising: a substrate; an insulating film formed on the substrate; a first semiconductor region having a first conductivity type formed on the insulating film; and a second semiconductor region having the first conductivity type and a third semiconductor region having a second conductivity type formed so as to adjoin the first semiconductor region and so as to face each other via the first semiconductor region,
a first electrode is formed on the second semiconductor region, and a second electrode is formed on the third semiconductor region, and
a diffusion layer having the first conductivity type, whose impurity concentration is varied from a side of the first electrode to a side of the second electrode, is formed on the first semiconductor region.

To achieve the above objects, a manufacturing method of a semiconductor device according to a fourth aspect of the present invention comprises the steps of:
preparing a substrate on which an insulating film is formed;
forming a first semiconductor region having a first conductivity type on the insulating film;
forming a second semiconductor region having the first conductivity type and a third semiconductor region having a second conductivity type so as to adjoin the first semiconductor region and so as to face each other via the first semiconductor region; and
forming a diffusion layer having the first conductivity type on the first semiconductor region, such that an impurity concentration of the diffusion layer is varied from a side of a first electrode formed on the second semiconductor region to a side of a second electrode formed on the third semiconductor region.

BRIEF DESCRIPTION OF THE DRAWINGS

These objects and other objects and advantages of the present invention will become more apparent upon reading of the following detailed description and the accompanying drawings in which.

DETAILED DESCRIPTION OF THE PREFERRED EMBODIMENTS

First Embodiment

A semiconductor device and a manufacturing method thereof according to the first embodiment of the present invention will now be explained with reference to the drawings. In the present embodiment, the explanation will be given by employing an example of a diode as a semiconductor device.

Figure 1:
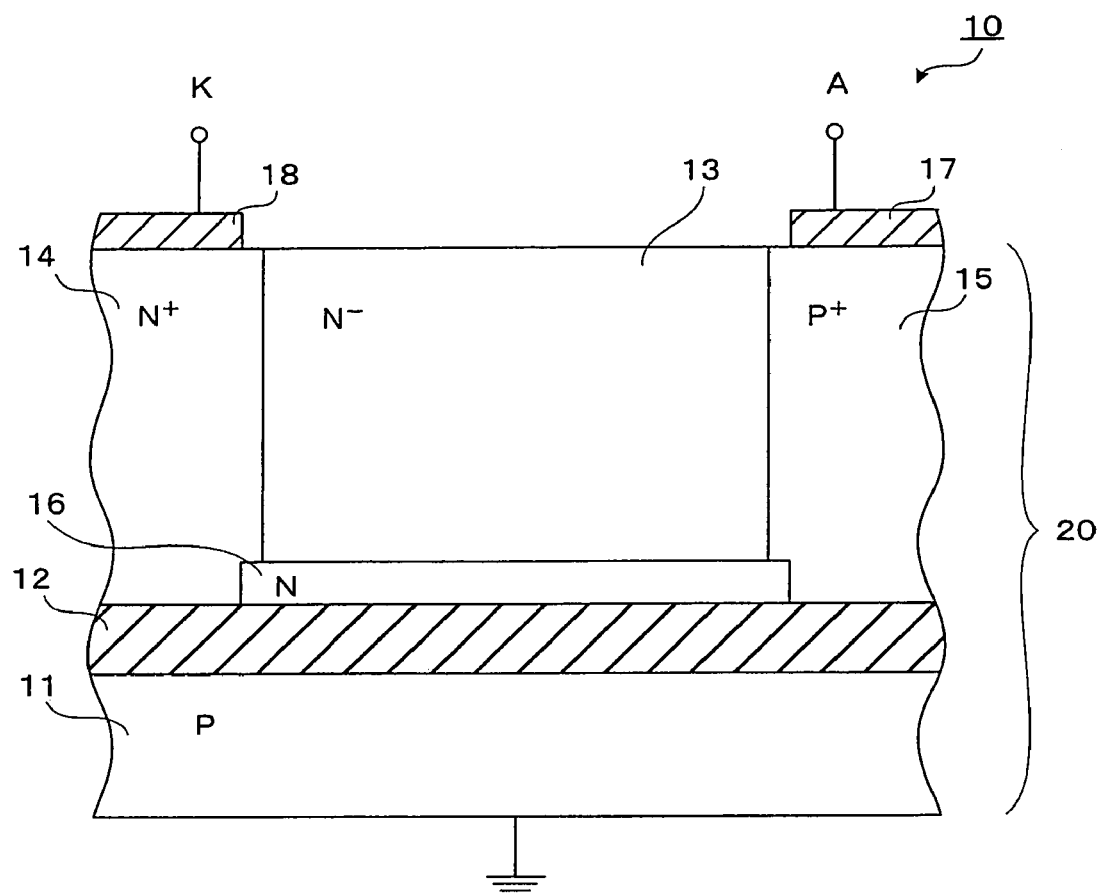
FIG. 1 is a cross-sectional view showing an example of the structure of a semiconductor device according to a first embodiment.
Figure 2A:
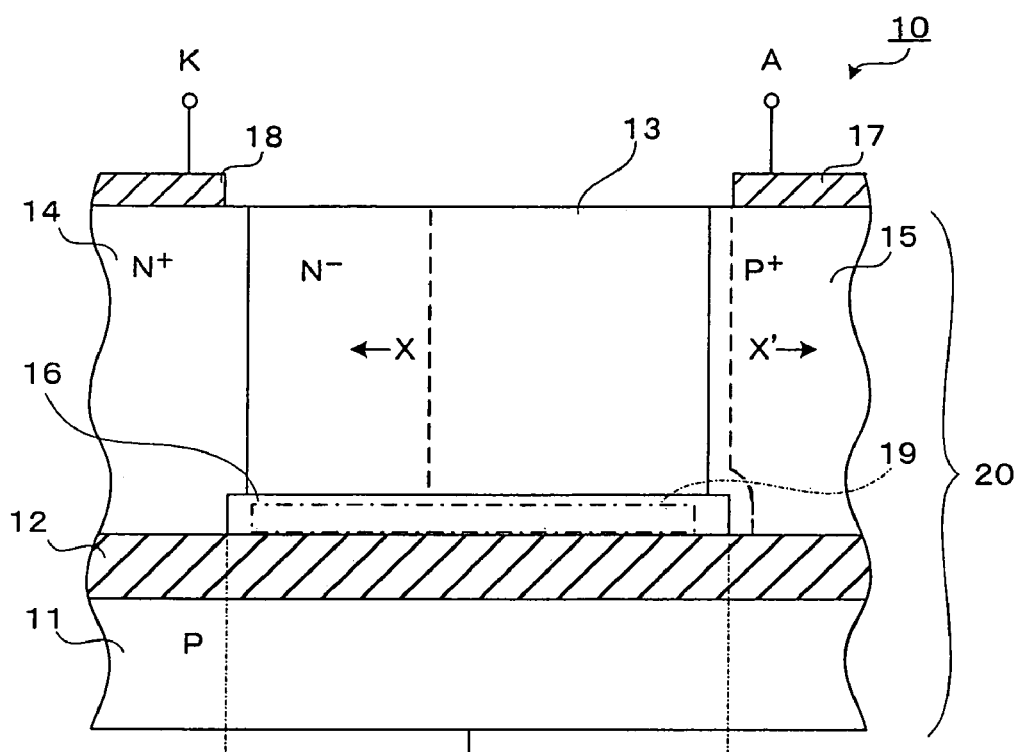
FIG. 2A is a cross-sectional view exemplarily showing a state where a reverse-direction voltage is applied to the semiconductor device shown in FIG. 1.

A semiconductor device 10 according to the first embodiment of the present invention is shown in FIG. 1 and FIG. 2A. FIG. 1 is a cross-sectional view of the semiconductor device 10. FIG. 2A is a cross-sectional view exemplarily showing the semiconductor device 10 in a state where a reverse-direction voltage is applied.

As shown in FIG. 1, the semiconductor device 10 comprises a semiconductor base 20, an anode electrode 17, and a cathode electrode 18.

The semiconductor base 20 comprises a P type semiconductor substrate 11, an insulating film 12, an N$^-$ type semiconductor region 13, an N$^+$ type semiconductor region 14, a P$^+$ type semiconductor region 15, and an N type diffusion layer 16.

The P type semiconductor substrate 11 is constituted by a P type semiconductor in which a P type impurity (second conductivity type) such as boron is diffused. The P type semiconductor substrate 11 is formed to have a thickness of, for example, about 620 µm, and an impurity concentration of about $3.33 \times 10^{14}$ cm$^{-3}$.

The insulating film 12 is formed of, for example, silicon dioxide, and is formed on the upper surface of the P type semiconductor substrate 11. The insulating film 12 is formed to have a thickness of, for example, about 3 µm.

The N$^-$ type semiconductor region 13 is formed of a semiconductor region of N type (first conductivity type) in which phosphorus, arsenic, etc. are diffused. The N$^-$ type semiconductor region 13 is formed on the upper surface of the insulating film 12, between which the N type diffusion layer 16 is sandwiched. The thickness of the N$^-$ type semiconductor region 13 is preferably 0.1 to 100 µm, and particularly preferably 1 to 10 µm, in order to facilitate the designing of the semiconductor device 10. The N type impurity concentration of the N$^-$ type semiconductor region 13 is about $1 \times 10^{13}$ to $1 \times 10^{16}$ cm$^{-3}$.

As will be described later, the N type diffusion layer 16 has an impurity concentration gradient from the side of the anode electrode 17 to the side of the cathode electrode 18, while the N⁻ type semiconductor region 13 has a generally constant impurity concentration, with no such impurity concentration gradient as that of the N type diffusion layer 16.

The N⁺ semiconductor region 14 is formed of an N type semiconductor region in which impurities of N type (first conductivity type) such as phosphorus, arsenic, etc. are diffused. The N⁺ semiconductor region 14 is formed on the upper surface of the insulating film 12 so as to adjoin the N⁻ type semiconductor region 13. The N type impurity concentration of the N⁺ type semiconductor region 14 is higher than that of the N⁻ semiconductor region 13, and is about $1\times10^{16}$ to $1\times10^{20}$ cm⁻³. The cathode electrode 18 is formed on the upper surface of the N⁺ type semiconductor region 14.

The P⁺ type semiconductor region 15 is formed of a P type semiconductor region in which an impurity of P type (second conductivity type) such as boron, etc. is diffused. The P⁺ type semiconductor region 15 is formed on the upper surface of the insulating film 12 so as to adjoin the N⁻ type semiconductor region 13 and so as to face the N⁺ type semiconductor region 14 via the N⁻ type semiconductor region 13. The P type impurity concentration of the P⁺ type semiconductor region 15 is higher than that of the P type semiconductor substrate 11, and is about $1\times10^{16}$ to $1\times10^{20}$ cm⁻³. The anode electrode 17 is formed on the upper surface of the P⁺ type semiconductor region 15.

The N type diffusion layer 16 is formed of an N type semiconductor region in which an impurity of N type (first conductivity type) such as phosphorus, arsenic, etc. is diffused. The N type diffusion layer 16 is formed on one surface of the N⁻ type semiconductor region 13 that contacts the insulating film 12. The N type diffusion layer 16 contacts the N⁻ type semiconductor region 13, the N⁺ semiconductor region 14, and the P⁺ type semiconductor region 15. The N type diffusion layer 16 is formed so as to be larger-sized than, so as to cover at least the upper surface of, and so as to include a P type inversion layer 19 as shown in FIG. 2A, which occurs when a reverse-direction voltage of equal to or higher than a predetermined degree (to produce a state where the cathode electrode 18 is at a higher voltage than the anode electrode 17 and also at a higher voltage than the bottom of the P type semiconductor substrate) is applied to the anode electrode 17 and cathode electrode 18 of the semiconductor device 10. In consideration of the thickness and forward-direction current of the semiconductor device, it is preferable that the N type diffusion layer 16 be thinner than the N⁻ type semiconductor region 13, so is formed to have a thickness of 0.01 to 1.00 μm, and preferably a thickness of 0.1 to 0.5 μm.

Figure 2B:
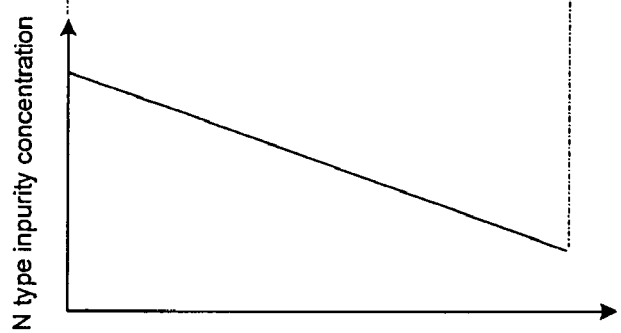
FIG. 2B is a diagram showing a gradient of the N type impurity concentration of an N type diffusion layer.
Figure 2C:
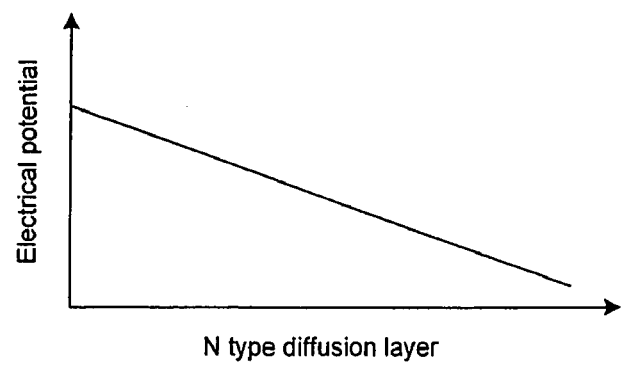
FIG. 2C is a diagram showing a distribution of electric potentials.

The N type diffusion layer 16 has a concentration gradient as exemplarily shown in FIG. 2B, where the N type impurity concentration decreases from the N⁺ type semiconductor region 14 (from the side of the cathode electrode 18) to the P⁺ type semiconductor region 15 (to the side of the anode electrode 17). The horizontal axis of FIG. 2B corresponds to the N type diffusion layer 16 shown in FIG. 2A.

The impurity concentration gradient of the N type diffusion layer 16 may be formed so as to increase stepwise from the side of the anode electrode 17 to the side of the cathode electrode 18. Alternatively, the N type diffusion layer 16 may include regions of two types, namely a first region having a constant impurity concentration and a second region having an impurity concentration higher than that of the first region, so that these regions may be alternately arranged. In this case, the second region having the higher impurity concentration is formed so as to have an impurity concentration which becomes higher as it approaches the cathode electrode 18. Then, the impurity concentration of the N type diffusion layer 16 is formed so as to increase from the anode electrode 17 to the cathode electrode 18 with repetitive ups and downs, with the values of average of the first region having the constant impurity concentration and its adjoining second region having the higher impurity concentration almost linearly increasing from the anode electrode 17 to the cathode electrode 18. The portion of the N type diffusion layer 16 that is nearest to the N⁺ type semiconductor region 14 is formed to have an average N type impurity concentration of, for example, about $8\times10^{17}$ cm⁻³, and the portion nearest to the P⁺ type semiconductor region 15 is formed to have an N type impurity concentration of about $3\times10^{16}$ cm⁻³. The concentration gradient of the impurity concentration of the N type diffusion layer 16 can easily be formed, if the N type diffusion layer 16 is formed by alternately arranging these two kinds of regions as described above.

The anode electrode 17 is formed of a metal multilayered film or the like made of, for example, gold-zinc alloy (Au—Zn), gold-beryllium-chromium alloy (Au—Be—Cr), and gold (Au), etc., and is formed on the upper surface of the P⁺ type semiconductor region 15 of the semiconductor base 20.

The cathode electrode 18 is formed of, for example, a gold-germanium alloy (Au—Ge) film, or a metal multilayered film made of Au—Ge, nickel (Ni), and gold (Au), and is formed on the upper surface of the N⁺ type semiconductor region 14 of the semiconductor base 20.

The semiconductor device 10 having this structure can achieve a favorable voltage withstand characteristic, by comprising the N type diffusion layer 16 having the impurity concentration gradient.

Figure 8:
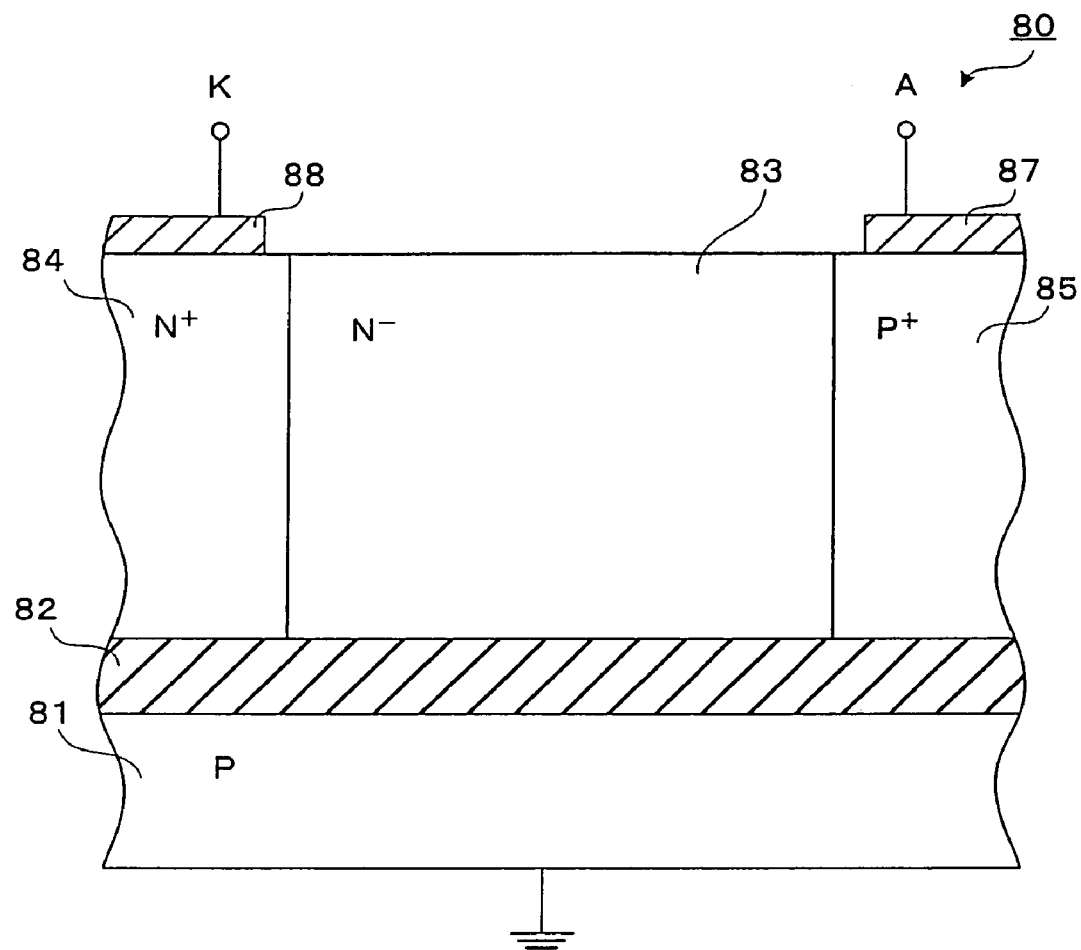
FIG. 8 is a cross-sectional view showing a conventional semiconductor device having the SOI structure.
Figure 9:
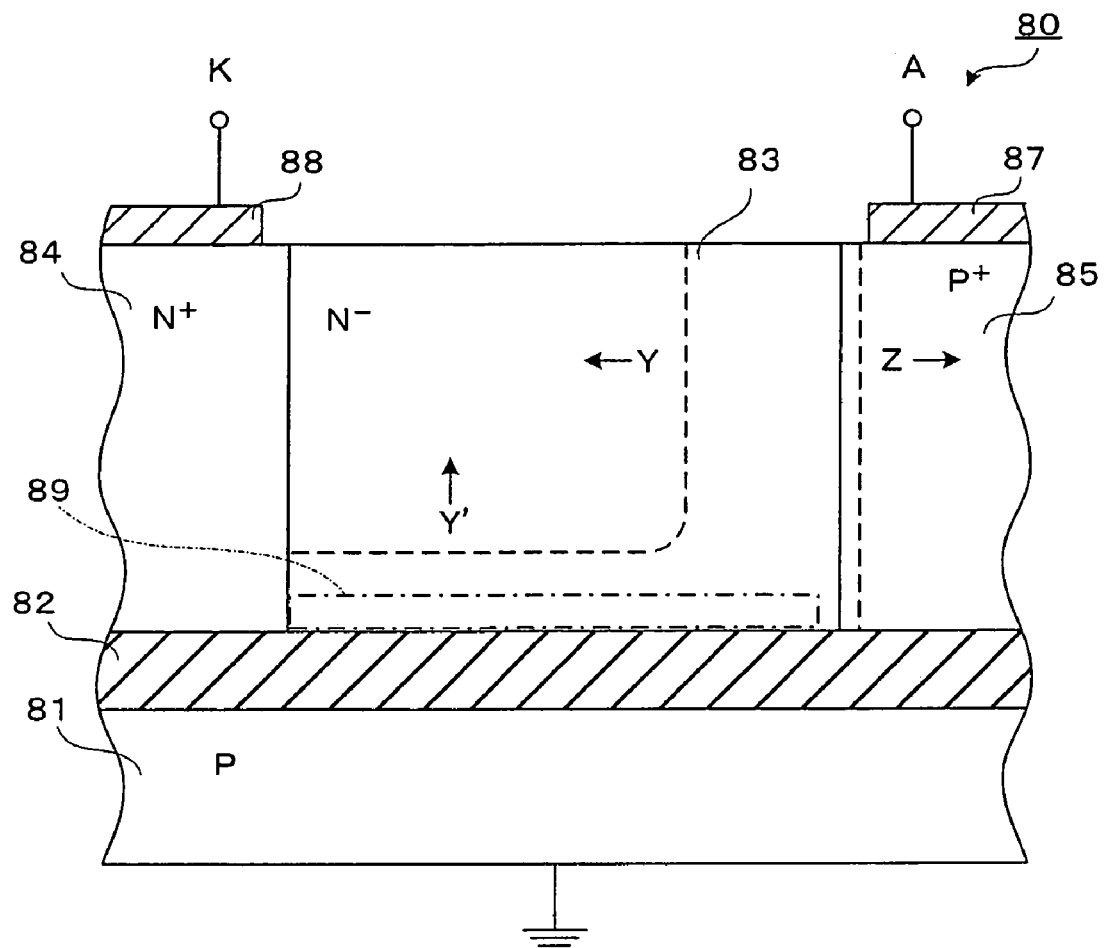
FIG. 9 is a cross-sectional view exemplarily showing a state where a reverse-direction voltage is applied to the semiconductor device shown in FIG. 8.

For example, when the conventional semiconductor device 80 shown in FIG. 8 having no N type diffusion layer, has a reverse-direction voltage (which puts the cathode electrode 88 at a higher voltage than the anode electrode 87, and puts the bottom surface of the P type semiconductor substrate 81 at a lower voltage than the cathode electrode 88) applied, an electric field is generated inside the semiconductor device 80 and a depletion layer expands as indicated by a broken line in FIG. 9 in the N⁻ type semiconductor region 83 and P⁺ type semiconductor region 85. The depletion layer expands in the N⁻ type semiconductor region 83 in directions Y and Y' indicated by the arrows in FIG. 9, and expands in the P⁺ type semiconductor region 85 in a direction Z indicated by the arrow. The depletion layer, which occurs in the N⁻ type semiconductor region 83 and P⁺ type semiconductor region 85 when a reverse-direction voltage is applied to the semiconductor device 80, tends to be narrower as the impurity concentration is higher, and broader up to a predetermined degree as the reverse-direction voltage is higher. Accordingly, the depletion layer appears more broadly in the N⁻ type semiconductor region 83 than in the P⁺ type semiconductor region 85 as shown in FIG. 9.

Further, if the reverse-direction voltage to be applied to the semiconductor device 80 is raised, the electric field to be generated in the N⁻ type semiconductor region 83 is increased to exceed a predetermined level of voltage, by which the N⁻ type semiconductor region 83 on the side of the cathode electrode 88 will get inversed to produce a P type inversion layer 89 in the N⁻ type semiconductor region 83 near its interface with the insulating film 82. If the reverse-direction voltage is further increased, the P type inversion layer 89 gradually expands towards the side of the anode electrode 87 along the interface between the N⁻ type semiconductor region 83 and the insulating film 82, and the concentration of the carriers (holes) of the P type inversion layer 89 in the region where the P type inversion layer 89 is generated becomes higher.

The state of inversion herein includes not only a state where holes are induced to the same degree as the concentration of the electrons in the semiconductor region before inverted, but also a state where holes start to be induced.

The P type inversion layer 89 thusly produced has a concentration gradient of the carriers (holes) that is nearly linear from the cathode electrode 88 to the anode electrode 87, with the carrier concentration of the P type inversion layer 89 being higher where closer to the cathode electrode 88 while being lower where closer to the anode electrode 87. As a result, the conventional semiconductor device 80 causes a breakdown at the interface between the P type inversion layer 89 at the side of the cathode electrode 88 (a region where the hole concentration is high due to the P type inversion) and the $N^+$ type semiconductor region 84, bringing about a decrease in the voltage withstand characteristic. If the reverse-direction voltage to be applied to the semiconductor device 80 is further increased, the concentration of the carriers (holes) in the P type inversion layer 89 is also further increased, with a further decrease in the voltage withstand characteristic.

In a case where the $N^-$ type semiconductor region 83 is formed thick in view of the voltage withstand characteristic, or in a case where the impurity concentration of the $N^-$ type semiconductor region 83 is increased in view of a forward-direction voltage, the depletion layer stops expanding any further when the inversion starts in the $N^-$ type semiconductor region 83 on the side of the cathode electrode 88, resulting in that the $N^-$ type semiconductor region 83 is not favorably depleted and the voltage withstand characteristic of the semiconductor device 80 is therefore lowered.

As shown in FIG. 1, the semiconductor device 10 of the present invention comprises the N type diffusion layer 16, which is formed to have its N type impurity concentration increase almost linearly from the side of the anode electrode 17 to the side of the cathode electrode 18. Further, the N type diffusion layer 16 is formed so as to cover the upper surface of the P type inversion layer 19 and to include the P type inversion layer 19.

When a predetermined reverse-direction voltage is applied to the semiconductor device 10, the concentration of holes in the P type inversion layer 19 produced near the interface between the N type diffusion layer 16 and the insulating film 12 can be suppressed from increasing, to make the concentration of the holes in the P type inversion layer 19 almost uniform from the side of the anode electrode 17 to the side of the cathode layer 18, since the N type diffusion layer 16 is formed to have a higher impurity concentration in its region close to the cathode electrode 18. As a result, a breakdown that might occur between the P type inversion layer 19 at the side of the cathode layer 18 and $N^+$ type semiconductor region 14 can be suppressed and the voltage withstand characteristic can be improved.

Further, when a predetermined reverse-direction voltage is applied to the semiconductor device 10 of the present invention, it is assumable that there occur a leak current (leakage current) 1 which flows from the $N^+$ type semiconductor region 14 via the $N^-$ type semiconductor region 13 to the $P^+$ type semiconductor region 15, and a leak current 2 which flows from the $N^+$ type semiconductor region 14 via the P type inversion layer 19 to the $P^+$ type semiconductor region 15. In the semiconductor device 10 according to the present invention, with the concentration of the holes in the P type inversion layer 19 made almost uniform from the side of the cathode electrode 18 to the side of the anode electrode 17, the electric potential gradient in the P type inversion layer 19 through which the leak current 2 passes, is improved to be uniform. Accordingly, the P type inversion layer 19 serves as if it were a resistive field plate, the expansion in the transverse direction of the depletion layer (electric field gradient) produced in the $N^-$ type semiconductor region 13 is made more uniform than in the conventional semiconductor device 80, generating a favorable depletion layer.

Specifically, in a case where the insulating layer 12 is formed to have a thickness of, for example, 3 μm, a semiconductor device having no N type diffusion layer has a voltage withstand characteristic of about 320V, whereas the semiconductor device 10 according to the present embodiment comprising the N type diffusion layer 16 has a voltage withstand characteristic of 1,245V. Therefore, by forming the N type diffusion layer 16, it is possible to achieve a voltage withstand characteristic of 3.8 or more times as high as that obtained in case of no N type diffusion layer.

As described above, according to the present invention, since it is possible to improve the voltage withstand characteristic by forming the N type diffusion layer 16 having a gradient of impurity concentration, it is possible to provide a semiconductor device having a favorable voltage withstand characteristic, without changing the thickness of the $N^-$ type semiconductor region 13, the impurity concentration of the $N^-$ type semiconductor region 13, etc.

Next, the manufacturing method of the semiconductor device 10 according to the present invention will be explained with reference to FIG. 3A to FIG. 3C. The manufacturing method to be described in the present embodiment is merely one example, thus the present invention is not limited to the method to be described below as long as a similar device to the semiconductor device 10 can be obtained.

First, an N type semiconductor substrate 21 is formed by doping and diffusing an N type impurity into a silicon monocrystalline substrate. Next, an unillustrated resist film is formed on the upper surface of the N type semiconductor substrate 21. A part of the formed resist film, that corresponds to where the $N^+$ type semiconductor region 14 is to be formed, is selectively etched out. As a result, an opening is formed where the $N^+$ type semiconductor region 14 is to be formed. Through this opening, an N type impurity (for example, phosphorus) is implanted to a predetermined depth, by an ion implantation technique. Then, the resist film is removed. Thus, the $N^+$ type semiconductor region 14 is formed.

Next, the upper surface of the N type semiconductor substrate 21 is covered with a resist film again. A part of the resist film, that corresponds to where the $P^+$ type semiconductor region 15 is to be formed, is selectively etched out. This forms an opening where the $P^+$ type semiconductor region 15 is to be formed. Through this opening, a P type impurity (for example, boron) is doped to a predetermined depth and diffused. The resist film is then removed. As a result, the $P^+$ type semiconductor region 15 is formed.

Likewise, a resist film (unillustrated) is formed on the lower surface of the N type semiconductor substrate 21. A part of the resist film, that corresponds to where the N type diffusion layer 16 is to be formed, is selectively etched out. An opening is thus formed where the N type diffusion layer 16 is to be formed. An N type impurity is doped through this opening to a predetermined depth and diffused. The resist film is then removed. Consequently, the N type diffusion layer 16 is formed as shown in FIG. 3A.

Next, a P type semiconductor substrate 22 is formed by doping and diffusing a P type impurity (boron, etc.) into a silicon monocrystalline substrate. Then, the insulating film 12 is formed on one surface of the P type semiconductor substrate 22 as shown in FIG. 3B, by thermal oxidation or CVD (Chemical Vapor Deposition).

Figure 3A:
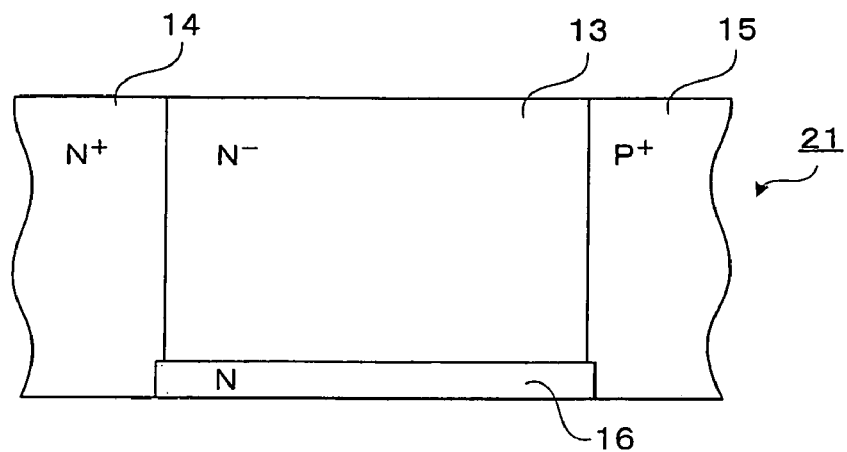
FIG. 3A to FIG. 3C are diagrams showing a manufacturing method of the semiconductor device according to the first embodiment.
Figure 3B:
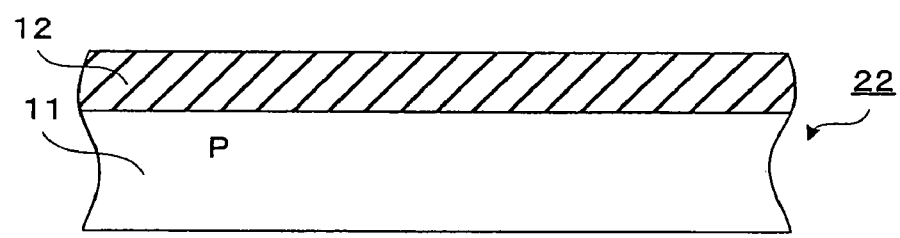

Then, the bottom surface of the N type semiconductor substrate 21 shown in FIG. 3A, in which the N type diffusion layer 16 is formed, is bonded to the surface of the P type semiconductor substrate 22 shown in FIG. 3B on which the insulating film 12 is formed.

Then, a film of metal (aluminum, copper, or nickel, etc.) is formed on the N type semiconductor substrate 21, by vacuum evaporation or the like. The thusly formed metal film is selectively patterned, to form the anode electrode 17 on the P+ type semiconductor region 15 and the cathode electrode 18 on the N+ type semiconductor region 14 respectively, as shown in FIG. 3C.

Figure 3C:
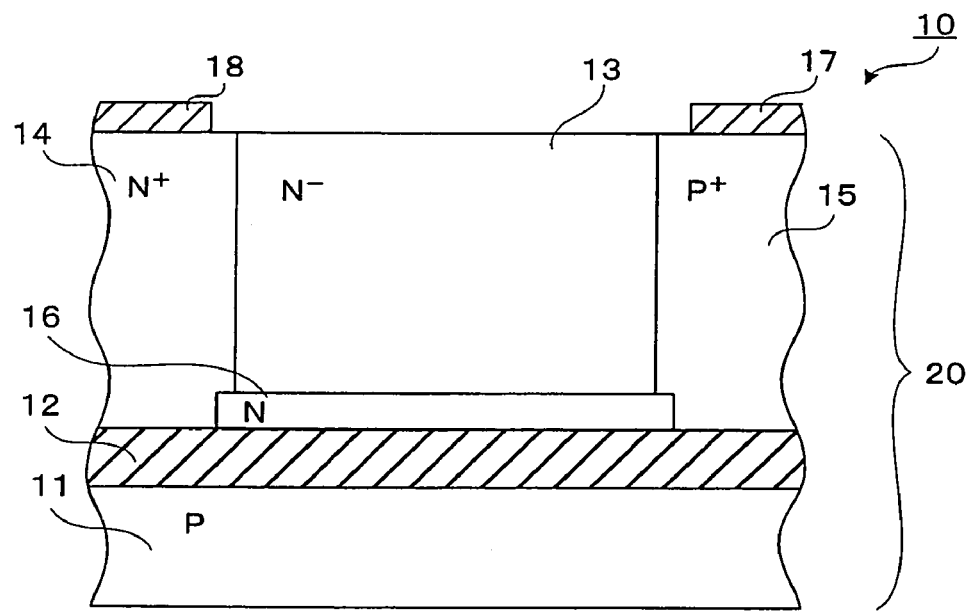

Through the above-described steps, the semiconductor device 10 according to the present embodiment shown in FIG. 3C is manufactured.

Second Embodiment

A semiconductor device 30 according to the second embodiment of the present invention will now be explained with reference to the drawings. The present embodiment is different from the first embodiment in that the semiconductor device is not a diode, but a MOSFET (Metal Oxide Semiconductor Field Effect Transistor). Any parts that are common with the first embodiment will be given the same reference numerals as used in the first embodiment, and a detailed explanation for such parts will be omitted.

Figure 4:
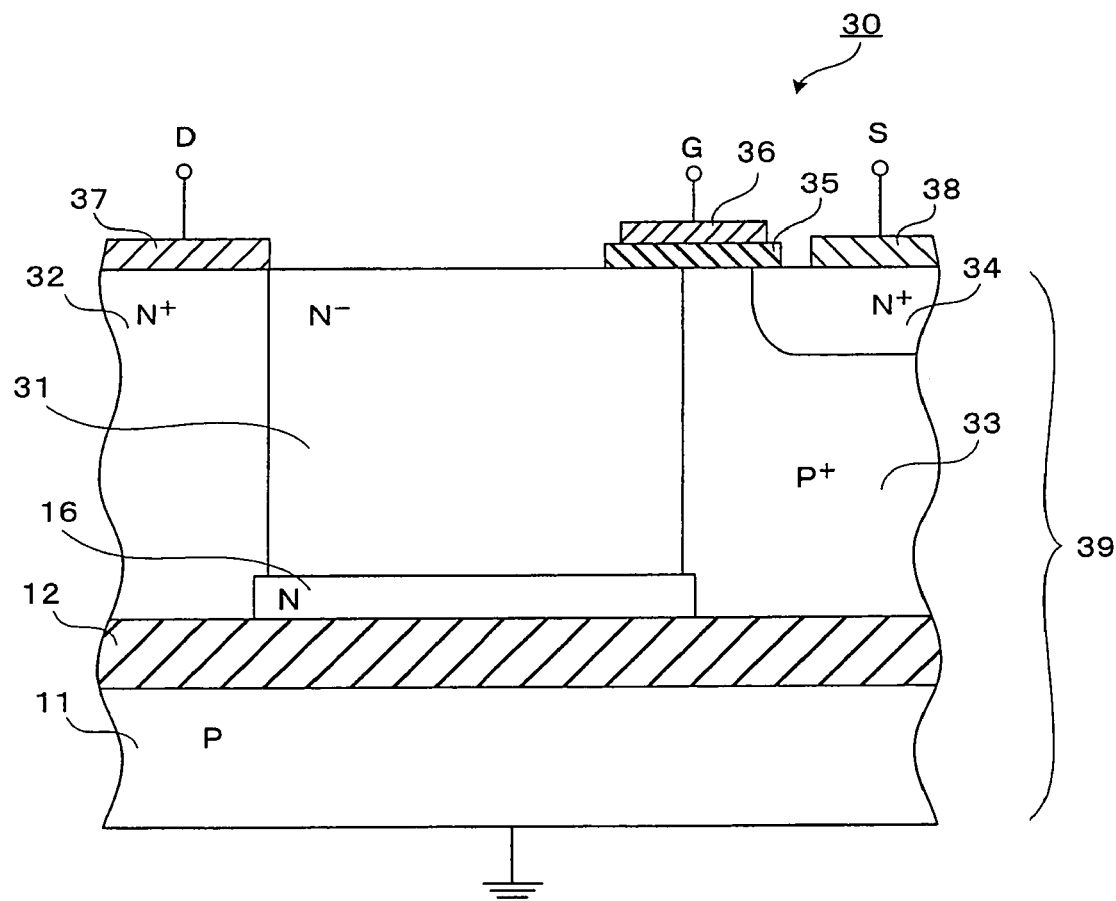
FIG. 4 is a cross-sectional view showing an example of the structure of a semiconductor device according to a second embodiment.

The semiconductor device 30 according to the second embodiment of the present invention is shown in FIG. 4. The semiconductor device 30 comprises a semiconductor base 39, a gate insulating film 35, a gate electrode 36, a drain electrode 37, and a source electrode 38.

The semiconductor base 39 comprises a P type semiconductor substrate 11, an insulating film 12, an N type diffusion layer 16, a drift region 31, a drain region 32, a base region 33, and a source region 34.

The drift region 31 is formed of an N type semiconductor region, and is formed on the insulating film 12 via the N type diffusion layer 16. The drain region 32 is formed of an N type semiconductor region, and is formed on the insulating film 12 so as to adjoin the drift region 31. The base region 33 is formed of a P type semiconductor region, and is formed on the insulating film 12 so as to face the drain region 32 via the drift region 31. The source region 34 is formed of an N type semiconductor region, and is formed in the surface region of the base region 33.

The drain region 32 and the source region 34 are formed to have a higher N type impurity concentration than that of the drift region 31. The base region 33 is formed to have a higher P type impurity concentration than that of the P type semiconductor substrate 11.

The drain electrode 37 and the source electrode 38 are formed of a metal multilayered film or the like, which is made of, for example, gold-zinc alloy (Au—Zn), gold-beryllium-chromium alloy (Au—Be—Cr), and gold (Au), etc. The gate electrode 36 is made of polysilicon or the like, and is formed on the base region 33 which is sandwiched between the drift region 31 and the source region 34, via the gate insulating film 35 made of a silicon oxide film or the like. The drain electrode 37 is formed on the drain region 32, and the source electrode 38 is formed on the source region 34.

The N type diffusion layer 16 is formed on the insulating film 12 formed on the P type semiconductor substrate 11, so as to adjoin the drift region 31, the drain region 32, and the base region 33. The N type diffusion layer 16 is formed so as to have an N type impurity concentration, which gradually decreases from the side of the drain electrode 37 (the side of the drain region 32) to the side of the source electrode 38 (the side of the source region 34), likewise the first embodiment.

According to the present embodiment as well as the first embodiment, the impurity concentration gradient of the N type diffusion layer 16 may be formed so as to linearly increase (or decrease), or may be formed to increase stepwise. Alternatively, the N type diffusion layer 16 may comprise two types of regions where the impurity concentration is constant and where the impurity concentration is higher than that in the other type of region, so that these regions may be arranged alternately.

By comprising the N type diffusion layer 16 having a gradient in its impurity concentration, the semiconductor device 30 having the above-described structure will produce an electric field therein and a depletion layer begins to expand in the drift region 31 and the base region 33 likewise the first embodiment, when a reverse-direction voltage (which puts the drain electrode 37 at a higher voltage than the source electrode 38 and puts the drain electrode 37 at a higher voltage than the bottom surface of the P type semiconductor substrate 11) is applied to the semiconductor device 30. When the reverse-direction voltage applied to the semiconductor device 30 is increased, the electric field produced in the drift region 31 is increased, and when the electric field exceeds a predetermined level, a P type inversion layer is produced near the interface between the insulating film 12 and the N type diffusion layer 16.

When the reverse-direction voltage is further increased, the P type inversion layer starts to gradually expand toward the side of the source electrode 38 along the interface between the N type diffusion layer 16 and the insulating film 12. Since the N type diffusion layer 16 according to the present embodiment is formed to have a higher impurity concentration in its region close to the drain region 32, the concentration of carriers (holes) in the P type inversion layer produced near the interface between the N type diffusion layer 16 and the insulating film 12 is suppressed from increasing in the region near the drain region 32. Accordingly, the concentration of the carriers (holes) in the P type inversion layer is made almost uniform from the side of the drain electrode 37 to the side of the source electrode 38. As a result, a breakdown that might occur between the P type inversion layer at the side of the drain electrode 37 and the drain region 32 is suppressed, making it possible to improve the voltage withstand characteristic of the semiconductor device 30.

Furthermore, likewise the above-described first embodiment, the gradient of electric potential due to a leak current flowing through the P type inversion layer is improved so as to be uniform, by making the carrier concentration of the P type inversion layer almost uniform from the side of the drain electrode 37 to the side of the source electrode 38. With the gradient of electric potential due to the leak current flowing through the P type inversion layer having an effect like a resistive field plate, the expansion in the transverse direction of the depletion layer (electric field gradient) produced in the drift region 31 is made uniform, and a favorable depletion layer is produced in the drift region 31. Therefore, the voltage withstand characteristic of the semiconductor device 30 can be improved.

Third Embodiment

A semiconductor device according to the third embodiment of the present invention will now be explained with reference to the drawings. The present embodiment is different from the first embodiment in that the semiconductor device is an insulated gate bipolar transistor (hereinafter referred to as IGBT). Any parts that are common with the first embodiment will be given the same reference numerals as used in the first embodiment, and a detailed explanation for such parts will be omitted.

Figure 5:
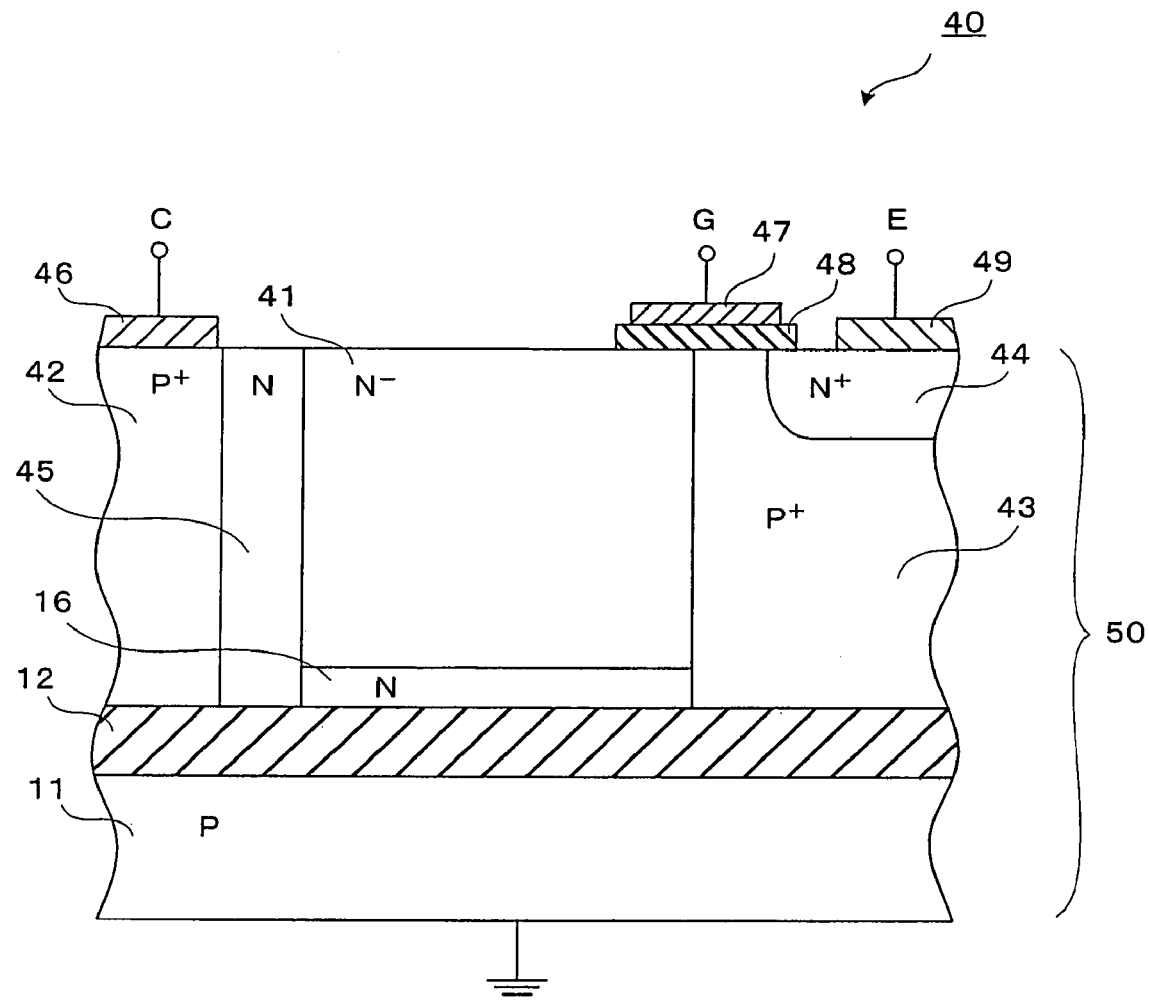
FIG. 5 is a cross-sectional view showing an example of the structure of a semiconductor device according to a third embodiment.

As shown in FIG. 5, a semiconductor device 40 comprises a semiconductor base 50, a collector electrode 46, a gate electrode 47, a gate insulating film 48, and an emitter electrode 49.

The semiconductor base 50 comprises a P type semiconductor substrate 11, an insulating film 12, an N type diffusion layer 16, an N$^-$ type base region 41, a P$^+$ type collector region 42, a P$^+$ type base region 43, an N$^+$ type emitter region 44, and an N type buffer region 45.

The N$^-$ type base region 41 is formed of an N type semiconductor region, and is formed on the insulating film 12. The N type buffer region 45 is formed of an N type semiconductor region, and is formed on the insulating film 12 so as to adjoin the N$^-$ type base region 41. The P$^+$ type collector region 42 is formed of a P type semiconductor region, and is formed on the insulating film 12 so as to adjoin the N type buffer region 45. The P$^+$ type base region 43 is formed of a P type semiconductor region, and is formed on the insulating film 12 so as to face the N type buffer region 45 via the N$^-$ type base region 41. The N$^+$ type emitter region 44 is formed of an N type semiconductor region, and is formed in the surface region of the P$^+$ type base region 43.

The N type buffer region 45 is formed so as to have an impurity concentration higher than that of the N$^-$ type base region 41 and lower than that of the N$^+$ type emitter region 44. The P$^+$ type base region 43 and P$^+$ type collector region 42 are formed to have a P type impurity concentration higher than that of the P type semiconductor substrate 11.

The collector electrode 46 and the emitter electrode 49 are formed of a metal multilayered film or the like made of, for example, gold-zinc alloy (Au—Zn), gold-beryllium-chromium alloy (Au—Be—Cr), and gold (Au), etc. The collector electrode 46 is formed on the collector region 42. The gate electrode 47 is made of polysilicon or the like, and is formed on the P$^+$ type base region 43, which is sandwiched between the N$^-$ type base region 41 and the N$^+$ type emitter region 44, via the gate insulating film 48. The emitter electrode 37 is formed on the N$^+$ type emitter region 44.

The N type diffusion layer 16 is formed on the insulating film 12 formed on the P type semiconductor substrate 11, so as to adjoin the N$^-$ type base region 41, the N type buffer region 45, and the P$^+$ type base region 43. The impurity concentration of the N type diffusion layer 16 is formed such that the N type impurity becomes lower from the side of the collector electrode 46 (the side of the P$^+$ type collector region 42) to the side of the emitter electrode 49 (the side of the N$^+$ type emitter region 44), likewise the first embodiment.

According to the present embodiment as well as the first embodiment, the impurity concentration gradient of the N type diffusion layer 16 may be formed so as to linearly increase (or decrease), or may be formed so as to increase stepwise. Alternatively, the N type diffusion layer 16 may comprise two types of regions where the impurity concentration is constant and where the impurity concentration is higher than that of the other region, so that these regions may be arranged alternately.

By comprising the N type diffusion layer having a gradient in the impurity concentration, the semiconductor device 40 having the above-described structure will have an electric field produced therein and have a depletion layer expand in the N$^-$ type base region 41 and the P$^+$ type base region 43 likewise the first embodiment, when a reverse-direction voltage (which puts the collector electrode 46 at a higher voltage than the emitter electrode 49, and puts the collector electrode 46 at a higher voltage than the bottom surface of the P type semiconductor substrate 11) is applied to the semiconductor device 40. When the reverse-direction voltage applied to the semiconductor device 40 is increased to consequently exceed a predetermined voltage, the electric field produced in the N$^-$ type base region 41 so increases that a P type inversion layer is generated near the interface between the insulating film 12 and the N type diffusion layer 16.

When the reverse-direction voltage is further increased, the P type inversion layer begins to gradually expand toward the side of the emitter electrode 49 along the interface between the N type diffusion layer 16 and the insulating film 12. Since the N type diffusion layer 16 according to the present embodiment is formed so as to have an impurity concentration which is higher in a region closer to the collector electrode 46, it suppresses the carriers (holes) of the P type inversion layer generated near the interface between the N type diffusion layer 16 and the insulating film 12 from increasing in the region closer to the collector electrode 46. Accordingly, the concentration of the carriers (holes) in the P type inversion layer is made almost uniform from the side of the collector electrode 46 to the side of the emitter electrode 49. As a result, a breakdown which might occur between the P type inversion layer at the side of the collector electrode 46 and the N type buffer region 45 is suppressed, making it possible to improve the voltage withstand characteristic of the semiconductor device 40.

Further, with the impurity concentration of the P type inversion layer made almost uniform from the side of the collector electrode 46 to the side of the emitter electrode 49, the gradient of electric potential due to a leak current through the P type inversion layer is improved so as to be uniform. With the gradient of electric potential due to the leak current flowing through the P type inversion layer having an effect like a resistive field plate, the expansion in the transverse direction of the depletion layer (electric field gradient) produced in the N$^-$ type base region 41 is made uniform, and a favorable depletion layer is produced in the N$^-$ type base region 41. Therefore, the voltage withstand characteristic of the semiconductor device 40 can be improved.

The present invention is not limited to the respective embodiments described above, but can allow various modifications and applications.

For example, the above-described first embodiment was explained by employing, as an example, a case where the N type diffusion layer 16 adjoins the N$^+$ type semiconductor region 14 and the P$^+$ type semiconductor region 15. However, the present invention is not limited to this, but the N type diffusion layer 16 may be formed so as to be apart from the N$^+$ type semiconductor region 14 and the P$^+$ type semiconductor region 15.

Further, the above-described first embodiment was explained by employing, as an example, a case where the N$^+$ type semiconductor region 14 and the P$^+$ type semiconductor region 15 are formed so as to contact the insulating film 12. However, the present invention is not limited to this. For example, such a structure may be employed in which the N$^+$ type semiconductor region 14 and/or the P$^+$ type semiconductor region 15 are/is formed so as to be apart from the insulating film 12, and also apart from the N type diffusion layer 16, as in a semiconductor device 60 shown in FIG. 6.

Figure 6:
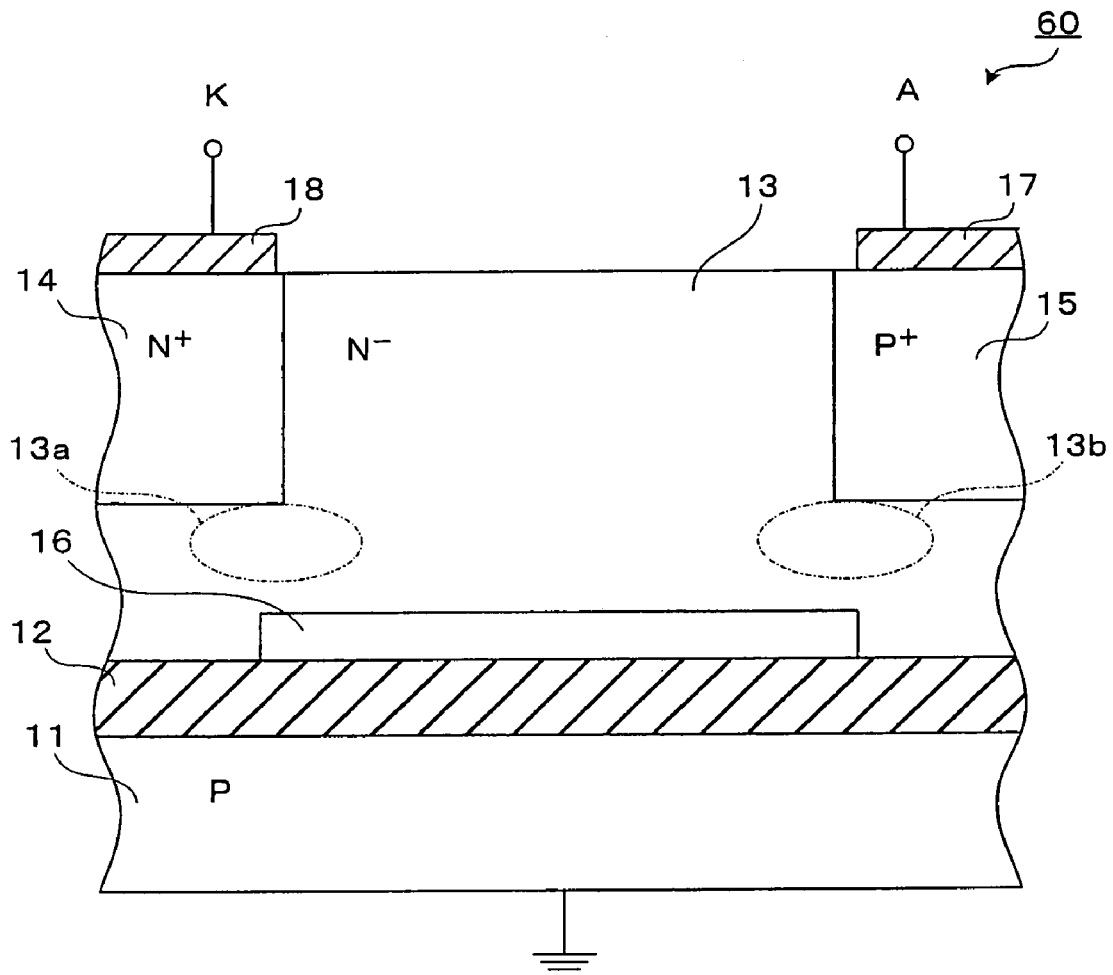
FIG. 6 is a cross-sectional view showing a modified example of the present invention.

A region 13a indicated by a dashed line in FIG. 6, which is present in the N$^-$ type semiconductor region 13 in the neighborhood of the N$^+$ type semiconductor region 14, is a region to which electrons are likely to move and collect when a reverse-direction voltage is applied to the semiconductor device 60. Likewise, a region 13b in the N⁻ type semiconductor region 13 in the neighborhood of the P⁺ type semiconductor region 15 is a region in which relatively a small amount of electrons are present. Accordingly, even in the case where the N type diffusion layer 16 does not contact the N⁺ type semiconductor region 14 or the P⁺ type semiconductor region 15, a similar structure to that of the semiconductor device 10 of the first embodiment is achieved.

According to the first embodiment, the N type diffusion layer 16 is formed on one surface of the N⁻ type semiconductor region 13, which contacts the insulating film 12. However, the N type diffusion layer 16 may be formed so as to be apart from the insulating film 12.

Further, the above-described embodiment was explained by employing, as an example, a case where the N type diffusion layer 16 contacts the N⁻ type semiconductor region 13. However, the present invention is not limited to this, but such a structure may be employed, in which an insulating layer 71 is formed on the surface of the N type diffusion layer 16 contacting the N⁻ type semiconductor region 13, as in a semiconductor device 70 shown in FIG. 7. If this structure is employed, it is possible to prevent the N type impurity of the N type diffusion layer 16 from diffusing into the N⁻ type semiconductor region 13, in a manufacturing step succeeding the step of forming the N type diffusion layer 16.

Figure 7:
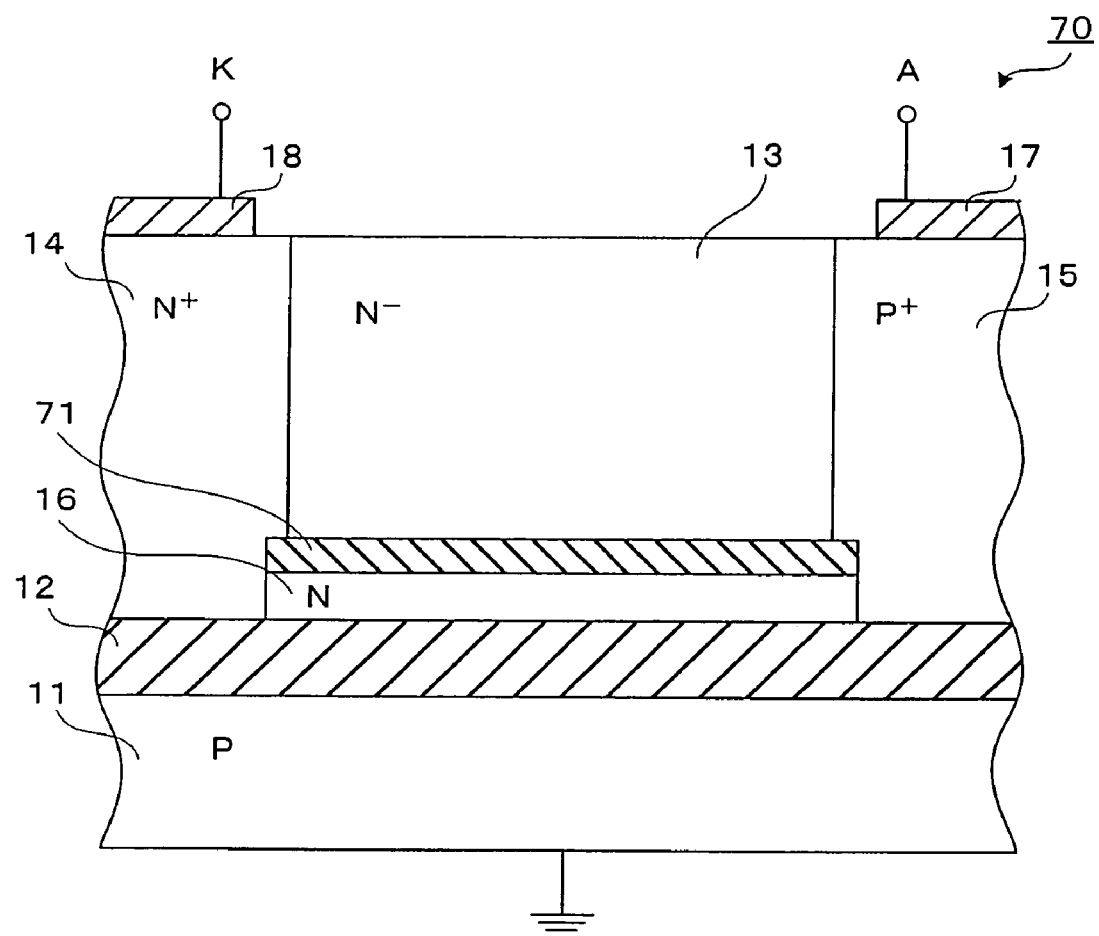
FIG. 7 is a cross-sectional view showing a modified example of the present invention.

Not only is it possible that the insulating layer 71 be formed on the surface of the N type diffusion layer 16 contacting the N⁻ type semiconductor region 13 as shown in FIG. 7, but also it is possible that the insulating layer 71 be formed on the surface of the N type diffusion layer 16 contacting the N⁻ type semiconductor region 13, and on the surface of the N type diffusion layer 16 contacting the N⁺ type semiconductor region 14 or the P⁺ type semiconductor region 15. In this case, the insulating layer 71 on the surface of the N type diffusion layer 16 contacting the N⁺ type semiconductor region 14 or the P⁺ type semiconductor region 15 is formed so as to expose at least a part of the N type diffusion layer 16.

Further, the structure in which an insulating layer is provided upon the N type diffusion layer 16 may be applied to the semiconductor device according to the second embodiment, to the semiconductor device according to the third embodiment, and to the semiconductor device 60 shown in FIG. 6.

Further, the above-described embodiments were explained by employing, as an example, a case where the P type semiconductor substrate 11 is formed of a P type semiconductor. However, the present invention is not limited to this, but the P type semiconductor substrate 11 may be formed of a silicon carbide (SiC) substrate, or an insulating substrate made of ceramic, etc.

In the above-described embodiments, only the manufacturing method of the semiconductor device 10 was explained. However, the semiconductor devices according to the second and third embodiments can also be manufactured by similar methods.

The above-described embodiments were explained by employing a diode, a MOSFET, and an IGBT as examples. However, the present invention is not limited to this, but may be used generally for semiconductor devices having the SOI structure such as a bipolar transistor, etc. if the portion to function as the device is so changed. Furthermore, the present invention can also be applied to an IC (Integrated Circuit) comprising plural types of semiconductor devices. That is, by carrying out the present invention, it is possible to easily improve the voltage withstand characteristic of conventional semiconductor devices having the SOI structure, without changing the design conditions of the devices.

In the above-described embodiments, it was explained that the first conductivity type is the N type, and the second conductivity type is the P type. However, the first conductivity type may be the P type, and the second conductivity type may be the N type. Furthermore, the thickness, the impurity concentration, etc. described in the embodiments are merely examples, and may thus be changed as needed.

Various embodiments and changes may be made thereunto without departing from the broad spirit and scope of the invention. The above-described embodiments are intended to illustrate the present invention, not to limit the scope of the present invention. The scope of the present invention is shown by the attached claims rather than the embodiments. Various modifications made within the meaning of an equivalent of the claims of the invention and within the claims are to be regarded to be in the scope of the present invention.

This application is based on Japanese Patent Application No. 2005-121434 filed on Apr. 19, 2005 and including specification, claims, drawings and summary. The disclosure of the above Japanese Patent Application is incorporated herein by reference in its entirety.

What is claimed is:

1. A semiconductor device, comprising
a semiconductor base comprising: a substrate; an insulating film formed on said substrate; a first semiconductor region having a first conductivity type formed on said insulating film; a diffusion layer formed between said first semiconductor region and said insulating film; a second semiconductor region having the first conductivity type formed on a surface region of said first semiconductor region; and a third semiconductor region having a second conductivity type formed on a surface region of said first semiconductor region so as to face said second semiconductor region via said first semiconductor region; said third semiconductor region adjoining to said first semiconductor region, while not adjoining to said second semiconductor region;
a first electrode formed on said second semiconductor region of said semiconductor base, and
a second electrode formed on said third semiconductor region of said semiconductor base,
wherein said semiconductor device further comprises said diffusion layer on a surface of said first semiconductor region contacting said insulating layer, said diffusion layer having a gradient of concentration of an impurity having the first conductivity type, from a side of said first electrode to a side of said second electrode.

2. A semiconductor device, comprising a semiconductor base comprising: a substrate; an insulating film formed on said substrate; a first semiconductor region having a first conductivity type formed on said insulating film; a diffusion layer formed between said first semiconductor region and said insulating film; a second semiconductor region having the first conductivity type formed on a surface region of said first semiconductor region; said second semiconductor region adjoining to said first semiconductor region; a third semiconductor region having a second conductivity type formed on a surface region of said first semiconductor region so as to face said second semiconductor region via said first semiconductor region; said third semiconductor region adjoining to said first semiconductor region, while not adjoining to said second semiconductor region; and a fourth semiconductor region formed in a surface region of said third semiconductor region,
a gate electrode formed so as to face said third semiconductor region, of said semiconductor base, which is sandwiched between said first semiconductor region and said fourth semiconductor region, a first electrode formed on said second semiconductor region of said semiconductor base, and a second electrode formed on said third semiconductor region of said fourth semiconductor base, wherein said semiconductor device further comprises said diffusion layer on a surface of said first semiconductor region contacting said insulating film, said diffusion layer having a gradient of concentration of an impurity having the first conductivity type, from a side of said first electrode to a side of said second electrode.

3. The semiconductor device according to claim 1, wherein said diffusion layer has a gradient of concentration of an impurity, which is almost constant from the side of said first electrode to the side of said second electrode.

4. The semiconductor device according to claim 1, wherein said diffusion layer is formed of a plurality of first regions formed so as to have a constant impurity concentration, and a plurality of second regions whose impurity concentrations are varied from the side of said first electrode to the side of said second electrode, wherein said first regions and said second regions are arranged alternately.

5. The semiconductor device according to claim 4, wherein values of average of the impurity concentration of said first region and the impurity concentration of said second region adjoining said first region have a gradient which is almost constant from the side of said first electrode to the side of said second electrode.

6. The semiconductor device according to claim 1, wherein said second semiconductor region and said third semiconductor region are formed so as to extend from the surface regions of said first semiconductor region so as to contact said insulating film, and said diffusion layer is formed so as to contact said second semiconductor region and said third semiconductor region.

7. The semiconductor device according to claim 1, further comprising an insulating film on a surface of said diffusion layer contacting said first semiconductor region, said insulating film being formed so as to expose at least a part of said diffusion layer.

8. The semiconductor device according to claim 1, wherein a thickness of said diffusion layer is 0.01 to 1.00 µm.

9. A semiconductor device, comprising a semiconductor base comprising: a substrate; an insulating film formed on said substrate; a first semiconductor region having a first conductivity type formed on said insulating film; a diffusion layer formed between said first semiconductor region and said insulating film; a second semiconductor region having the first conductivity type and a third semiconductor region having a second conductivity type formed so as to adjoin said first semiconductor region and so as to face each other via said first semiconductor region, said third semiconductor region not adjoining to said second semiconductor region;

wherein a first electrode is formed on said second semiconductor region, and a second electrode is formed on said third semiconductor region, and a diffusion layer having the first conductivity type, whose impurity concentration is varied from a side of said first electrode to a side of said second electrode, is formed on said first semiconductor region.

10. A semiconductor device, comprising a semiconductor base comprising: a substrate; an insulating film formed on said substrate; a first semiconductor region having a first conductivity type formed on said insulating film; a diffusion layer formed between said first semiconductor region and said insulating film; a second semiconductor region having a second conductivity type formed on a surface region of said first semiconductor region via a buffer region; and a third semiconductor region having the second conductivity type formed on a surface region of said first semiconductor region, said third semiconductor region adjoining to said first semiconductor region while not adjoining to said second semiconductor region; and a fourth semiconductor region formed in a surface region of said third semiconductor region;

a first electrode formed on said second semiconductor region of said semiconductor base, and a second electrode formed on said fourth semiconductor region of said semiconductor base, wherein said semiconductor device further comprises said diffusion layer on a surface of said first semiconductor region contacting said insulation layer, said diffusion layer having a gradient of concentration of an impurity having the first conductivity type, from a side of said first electrode to a side of said second electrode.

* * * * *